United States Patent [19]

Voss et al.

[11] Patent Number: 4,555,024

[45] Date of Patent: Nov. 26, 1985

[54] PACKAGING UNIT FOR SEMICONDUCTOR WAFERS

[75] Inventors: Jürgen Voss, Burghausen; Otto Dombkowski, Kirchdorf; Walter Kudlich, Burghausen; Jan Stodulka, Tittmoning, all of Fed. Rep. of Germany

[73] Assignee: Wacker-Chemie GmbH, Munich, Fed. Rep. of Germany

[21] Appl. No.: 668,405

[22] Filed: Nov. 5, 1984

[30] Foreign Application Priority Data

Apr. 12, 1984 [DE] Fed. Rep. of Germany ....... 3413837

[51] Int. Cl.$^4$ ...................... B65D 85/30; B65D 57/00; B65D 81/00
[52] U.S. Cl. ................................... 206/454; 206/334; 206/564; 206/586
[58] Field of Search ................ 206/454, 334, 564, 586

[56] References Cited

U.S. PATENT DOCUMENTS

| | | | |
|---|---|---|---|
| 4,043,451 | 8/1977 | Johnson | 206/454 |
| 4,061,228 | 12/1977 | Johnson | 206/454 |
| 4,160,504 | 7/1979 | Kudlich et al. | 206/454 |
| 4,450,960 | 5/1984 | Johnson | 206/454 |

Primary Examiner—William T. Dixson, Jr.
Attorney, Agent, or Firm—Collard, Roe & Galgano

[57] ABSTRACT

A three-component tray-type packaging unit for semiconductor wafers, compatible with automatic equipment, includes a wafer carrier enclosed between a tub-shaped lower portion for receiving the wafer carrier and a matching lid. The wafers are fixed at four contact points-namely, in the wafer carrier by two rows of spring tongues arranged tangentially with respect to the wafer, and in the matching lid by two rows of inwardly projecting retention cones.

7 Claims, 11 Drawing Figures

PACKAGING UNIT FOR SEMICONDUCTOR WAFERS

This invention relates to a tray-type packaging unit for semiconductor wafers, having a wafer carrier accommodating the wafers, a tub-shaped container for accommodating the wafer carrier, and a matching lid.

Packaging units for semiconductor wafers have to satisfy highly exacting demands. They have to assure reliable protection of the wafers against contamination, for example by dust, air humidity or by the packaging material itself. Furthermore, because of the sensitivity of the wafers to breakage and damage of the surface, they have to prevent mechanical stress to the highest possible degree. In addition, it is preferable that such packages be light weight and have minimal space requirements permitting savings on transportation and storage costs. Finally, it is increasingly important that such packages be compatible with automatic equipment, i.e., in the typically automated processing sequence, wherein the wafers must be capable of being admitted into their own process trays directly and without complicated prior pre-packaging.

Especially in view of the last mentioned requirement, most conventional packages for semiconductor wafers consist of three components-namely, a container, a matching lid and a wafer carrier for receiving the wafers. In order to assure that such wafer carriers can be used universally, the "Semiconductor Equipment and Materials Institute" (SEMI) issued a standard specifying the characteristic size of wafer carriers (cf. E.1, SEMI Specification for Wafer Carriers, published in January 1981, revised in August 1981). This standard, for example, may specify either the shape of the top and face sides of the wafer carrier or the number of wafers accommodated in the carrier and the spacing between the wafers, which is determined by guide ribs.

However, packaging units designed in accordance with the SEMI standard have serious drawbacks, such as, for example, a high weight, lack of stackability, an inability to check the content when the package is closed, poor fixation of the wafers, and contamination, particularly due to wear on the contact areas between the wafers and packaging unit. The last-mentioned problem is encountered primarily in cases in which the wafers are supported by spring tongues extending approximately parallel to the guiding ribs. When the wafers are inserted, said spring tongues are widely deflectd, resulting in heavy wear.

It is, therefore, an object of the present invention to propose a packaging unit for semiconductor wafers which satisfies the requirements under the SEMI standard and eliminates at the same time the drawbacks of the known packaging units.

This object is accomplished by an improved packaging unit of the type which includes a wafer carrier for receiving the wafers which is open at the top and bottom and has guide ribs on both longitudinal sides and a crossbar at one open end face thereof, a generally tub-shaped container for receiving the wafer carrier, and a matching lid having a cross-sectional generally polygonal profile configured to generally conform to the circumference of the wafers. The improved packaging unit is characterized by providing the wafer carrier with a plurality of spring tongues arranged on both longitudinal sides thereof such that they are each disposed between a pair of adjacent guide ribs on the same level corresponding to about one fifth to one third of the lateral height of the carrier. These tongues have a free end extending downwardly into the interior of the wafer carrier at an angle deviating from 0° to 30° from the horizontal, with the length of the tongues being selected such that, upon loading of a wafer, the points of support of a wafer on said tongues and the center point of the wafer enclose an angle of from 75° to 120°.

In addition, the lid is provided with a plurality of retention cones arranged on the inner side thereof in at least one row. These cones project inwardly and abut each other at their bases with the spacing between the center points of adjacent cones being equal to the spacing of the guide ribs in the wafer carrier and with the conical surfaces of adjacent retention cones cooperatively defining an included angle of from 60° to 90°. The cones are positioned such that, when a wafer is received within the packaging unit and the lid is closed, their points of contact on the edge of the wafer form an angle of from 0° to 50°, with respect to the center of the wafer.

Furthermore, the container has a plurality of lateral surface portions arranged to fix the wafer carrier in the longitudinal and transverse directions with predetermined close tolerances. Provision is also made for snap lock means for connecting the container and the matching lid to each other.

Moreover, the lid has a step-like ledge for fixing the wafer carrier within the matching lid and container which aligns the top edge of the wafer carrier with the lid such that corresponding and oppositely-disposed guide ribs and retention cones are arranged in one plane. As a result, when the wafers are received within the packaging unit and the lid is closed, the wafers come into contact only with the conical surfaces of adjacent holding cones and the free end of the spring tongues.

Materials suitable for the manufacture of the two outer parts of the packaging unit include thermoplastics in general, i.e., dense and mainly linear high polymers without homogeneous cross-linking, which are reversibly soft and moldable at elevated temperatures, and which do not contain additives capable of reducing the quality of the packaged wafers due to migration from the material. By way of example, suitable materials include polyolefins, polyamides, linear polyesters, polyurethanes, polystyrene, and, especially, polyvinyl chloride, preferably in the form of so-called "hard PVC", which exhibits high impact strength.

In a preferred embodiment of the invention, the outer parts are made from a foil with 1.0 to 2.0 mm thickness, using the injection molding process, as a rule, or more desirably, the hot molding process. The lid and typically the entire outer container is made of transparent plastic material, which facilitates the visual observation of the contents in the packaging unit.

The wafer carrier, which is preferably produced by injection molding for maximum efficiency, is made of thermoplastics which are generally chemically inert to the wafers, and which are derived from partially crystalline thermoplastics, such as polytetrafluoroethylene, polytrifluorochloroethylene, polypropylene or polyethylene.

Other objects and features of the present invention will become apparent from the following detailed description when taken in connection with the accompanying drawings, which disclose several embodiments of the invention. It is to be understood that the drawings are designed for the purposes of illustration only, and are not intended as a definition of the limits and scope of the invention disclosed.

BRIEF DESCRIPTION OF THE DRAWINGS

In the drawings, wherein similar reference numerals denote similar elements throughout the several views.

DETAILED DESCRIPTION OF THE PREFERRED AND ILLUSTRATED EMBODIMENTS

Figure 1:
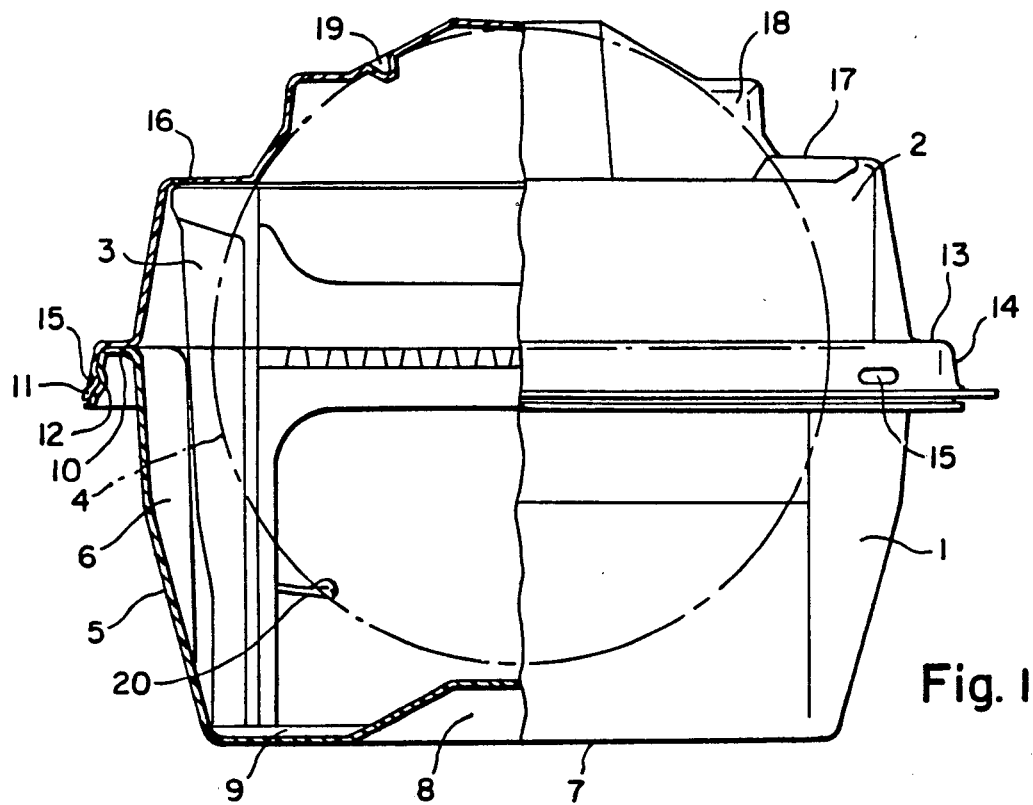
FIG. 1 is a front elevational view of the packaging unit, partially in cross-section on the left side.

Referring now in detail to the drawings, therein illustrated is a novel packaging unit according to the invention which, as shown in FIG. 1, comprises a tub-shaped container and a matching lid 2. These parts surround a wafer carrier 3 with a semiconductor wafer 4. The container 1 has longitudinally-extending sidewalls 5, which initially flare outwardly and upwardly at a relatively large angle and then, starting at a generally intermediate point, at a relatively slight angle. Preferably, these sidewalls have generally semicylindrical recessed sections 6 (see also FIG. 2). These recessed sections 6 limit the lateral clearance of wafer carrier 3. Similarly, a flat supporting bottom wall 7 of container 1 is provided with a longitudinally-extending recessed section 8 which has an arched or curved polygonal cross-sectional profile. Bottom wall 7 further has laterally extending supports 9, on which wafer carrier 3 rests. Container 1 is provided with a horizontally-disposed top wall 10 having a downwardly depending outer flange or edge 11, so as to define a peripherally-extending channel. Within the zone of the preferably rounded corners, outer edge 11 has inwardly-arched snap-receiving elongated recesses 12 formed therein on each lateral surface of the corners.

To mate with the top edge of container 1, cover 2 is provided at its lower edge with a generally flat, horizontally disposed supporting base wall 13 having a downwardly depending rim 14 which is provided with complementary-configured inwardly-arched snap beads 15 disposed within the zone of the corners for snap-fit engagement with recesses 12. According to a preferred embodiment of the invention, top wall 10 of container 1 is provided with depressions (not shown in the drawing) so that container 1 and matching lid 2 are not resting completely tight and flat against each other, and so that intermediate spaces are formed which facilitate the pressure compensation between the interior space of the package and the exterior environment. At about the level of half of its height, lid 2 which in its center region has a polygon-like curvature matching the curvature of the wafers, is surrounded by a step-like ledge 16, which is positioned for fixing the height of the wafer carrier 3. A plurality of elevations 17, which point diagonally in the direction of the corners, are required on account of a guide pin provided on the wafer carrier 3 in accordance with the SEMI specification. An additional step 18 advantageously arranged on the longitudinal sides of the lid enlarges the supporting surface when the packaging units are stacked one on top of the other and the recessed section 8 of container 1 comes to rest in each case on the matched vaulted shape of the corresponding lid of the packaging unit disposed therebelow. Finally, between the step 18 and the crest line of the lid 2, a plurality of retention cones 19 project inwardly, serving the purpose of retaining or fixing the wafers from the top. Preferably, the position of retention cones 19 is selected in such a way that their points of contact on the edge of the wafers form an angle of 0° to 50°, preferably from 30° to 50°, with respect to the center of the wafers (see FIG. 7). Smaller angles from 0° to 30° are possible, up to the minimum limit of one single row of frustoconical retention cones extending along the crest line.

The shape of the wafer carrier 3 is largely specified by the SEMI standard, for example with respect to the shape of its top edge and the design of its guide ribs for the wafers and a crossbar provided on a narrow side. According to the invention, the semiconductor wafers 4 are maintained in a fixed position within carrier 3 by two rows of spring tongues 20 provided between the guide ribs in such a way that they extend inwardly from a point at a level corresponding to about one fifth to one third, preferably about one fourth, of the lateral height. Spring tongues 20 are support surfaces for wafers 3. Generally, spring tongues 20 are slightly tilted downwardly even in the unloaded state, i.e., by 0° to 30°, preferably from 5° to 10° from the horizontal. Their length is selected in such a way that the points of contact of spring tongues 20 with the wafers 3 and the center point of each wafer form an angle of from 75° to 120° (see FIG. 7).

Figure 2:
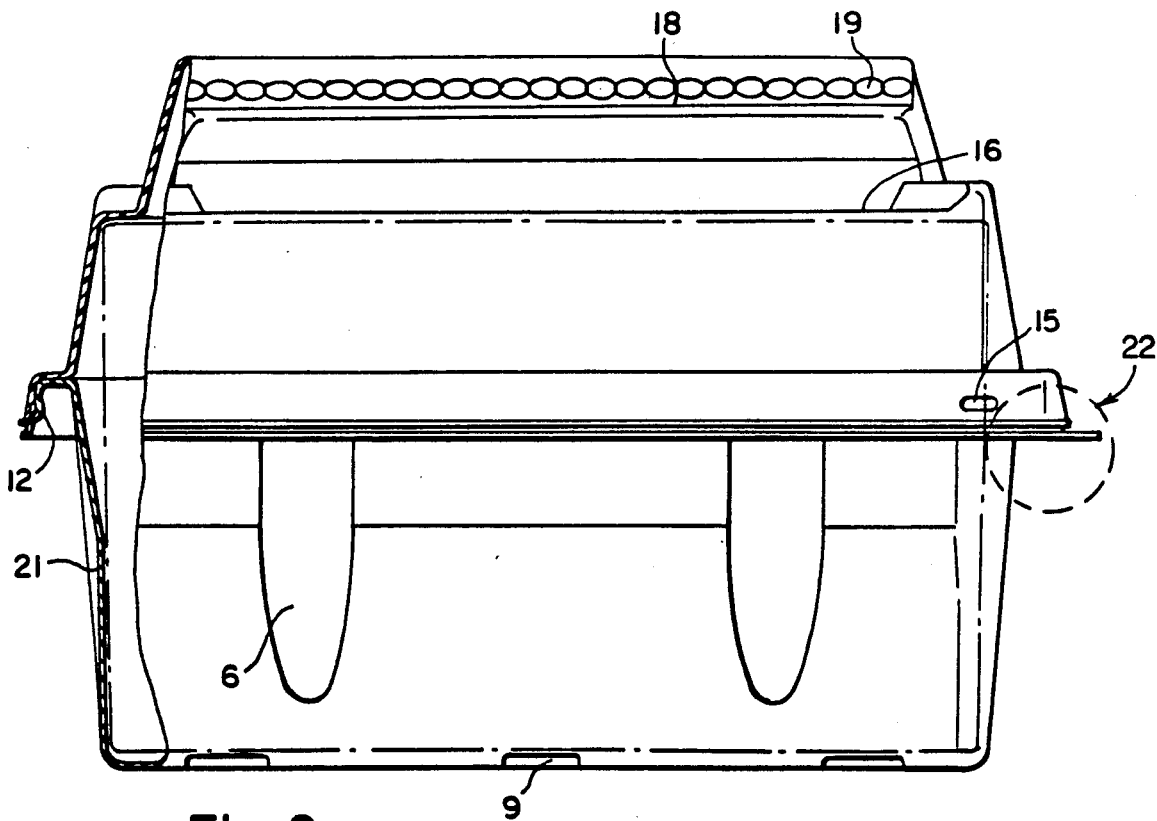
FIG. 2 is a longitudinal side elevational view of the packaging unit, partially in cross-section on the left side.

By way of example, FIG. 2 shows how the wafer carrier 3 is fixed in the container 1 and lid 2, namely in the lateral direction by the recessed sections 6 in the sidewalls 5 and in the longitudinal direction by an indented section 21 provided in the end walls. The height is fixed by way of the supports 9 in container 1, on the one hand, and via ledge 16 provided on lid 2, on the other hand. In this way, wafer carrier 3, container 1 and the lid 2 are maintained in a position in which the corresponding sets of guide ribs (not shown) and retention cones 19 are arranged in one plane.

Figure 3:
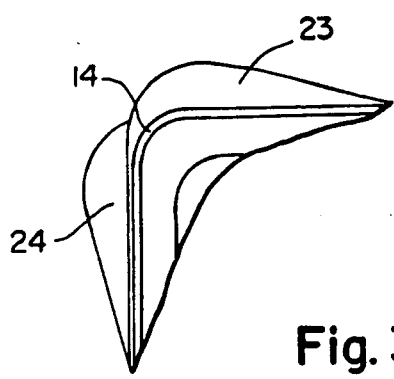
FIG. 3 is a fragmentarily-illustrated plan view of a corner of the packaging unit container and lid showing the relationship of the closure flaps.

FIG. 3 shows by a top view how the zone identified in FIG. 2 by reference number 22 can be designed on at least one corner, resulting in a favorable embodiment of the invention, which facilitates the opening of the packaging unit. With this design, rim 14 of lid 2 ends in a top flap 23 and outer edge 11 of lower portion 1 ends in a bottom flap 24. When so arranged, both flaps are displaced by 90°, thereby permitting unlocking of the snap lock or closure 12, 15 at the corner by a simple turning motion with the thumb and forefinger.

Figure 4:
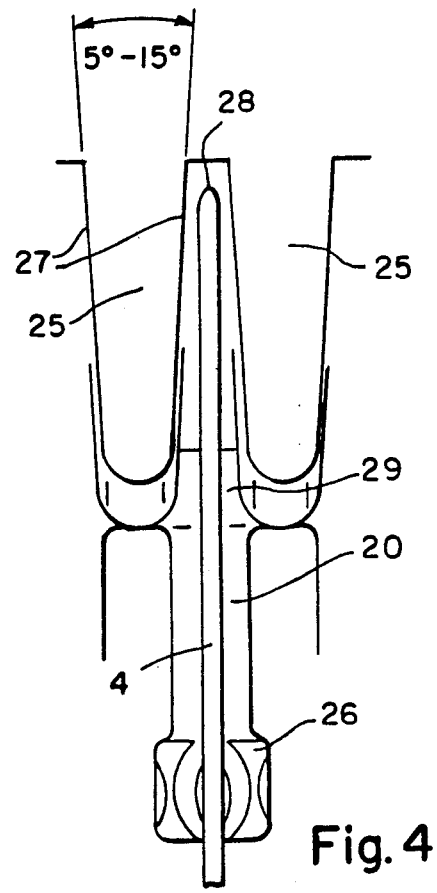
FIG. 4 is an enlarged fragmentarily-illustrated plan view showing how semiconductor wafers are supported and positioned within the unit.

FIG. 4 is a plan view which illustrates how the semiconductor wafers 4 are arranged in the closed packaging unit between the guide ribs 25 of wafer carrier 3. The semiconductor wafers rest in the package completely unsupported except for the point of contact with the wafer carrier at the head ends 26 of spring tongues 20. The flanks 27 of guide ribs 25 extend with an angle of 5 to 15 degrees, preferably about 7 degrees relative to each other, which assures that when the wafer carrier is loaded, only the rounded edge 28 of the wafer can come into contact with the carrier. Spring tongues 20 are connected to guide ribs 25 via spring tongue shafts 29.

Figure 5:
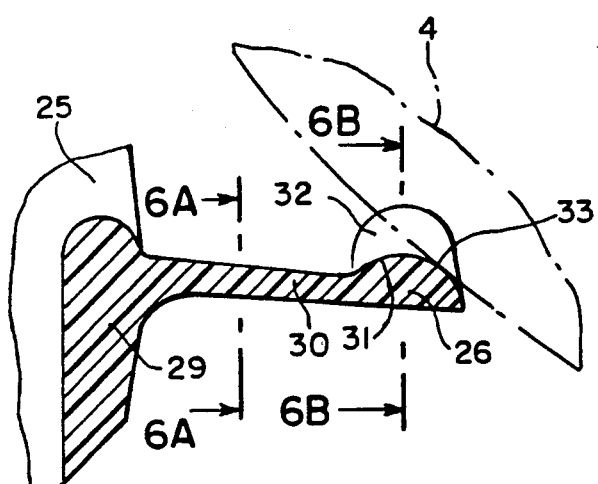
FIG. 5 is an enlarged cross-sectional side view of a spring tongue component of the unit for holding a wafer, the latter of which is shown in phantom line.
Figure 6A:
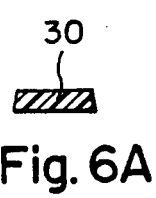
FIG. 6A is a cross-sectional view taken through line 6A—6A.
Figure 6B:
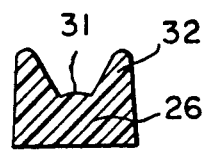
FIG. 6B is a cross-sectional view taken through line 6B—6B.

The spring tongues are preferably designed as shown in FIGS. 5, 6a and 6b. As shown in FIG. 5, each of the spring tongues comprises a support shaft 29, which is arranged between each pair of guide ribs 25. Shaft 29 merges with a flat neck 30 which terminates in a free end or head 26. Tongue head 26 has a central convex support or contact area 31 which is straddled on both sides by rounded guide elements 32. FIG. 6a illustrates a cross-sectional view of the spring tongue neck 30 and FIG. 6b illustrates a cross sectional view of the spring tongue head 26. Within head 26 of spring tongue 20, the inner sides of the semi-hump-like guide elements 32 slope downwardly at a steep angle toward the convex contact or support area 31. It is desirable that the angle of inclination be selected with a steepness sufficient to assure that due to the force of gravity, the edge of the wafer will always slide downwardly and come to rest on the supporting area 31. In this way, the area of contact 33 between wafer 4 and spring tongue head 26 is kept to a minimum, and because of the tangential arrangement of the spring tongues 20, when the wafers are loaded or removed, the relative motion between the two is kept to a minimum. This greatly reduces, in particular, the possibility of wear due to friction. Most advantageously, the spring tongue heads 26 are designed in such a way that when they are arranged in a row, the spacings between these heads will be sufficiently small to prevent the wafers from getting into the intermediate spaces when they are loaded.

Figure 7:
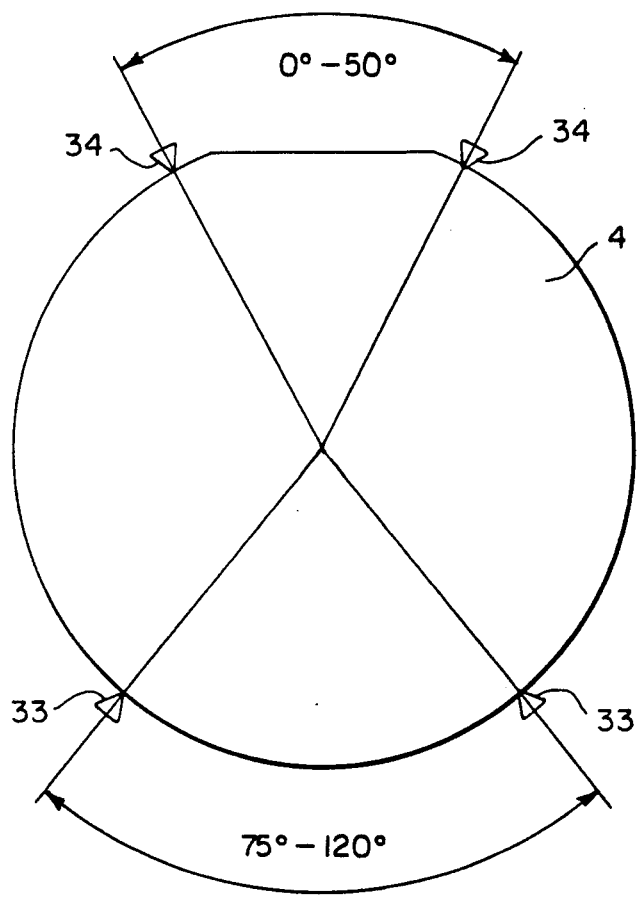
FIG. 7 is a schematic view of a semiconductor wafer depicting the range of points of contact of the wafer with the unit.

FIG. 7 illustrates the points at which forces act on a wafer 4, and which the wafer comes into contact with, when the packaging unit is closed. Wafer 4 rests on the contact areas 33 of the two spring tongues 20, at an angle of from 75° to 120° with respect to the center point of the wafer. The forces by which the wafers are pressed against the spring tongues 20 exert pressure upon the wafers at the points 34, where the edge of the wafer rests on lid 2 within the zone of the inwardly projecting retention cones 19. According to the preferred design, these points 34 form an angle of from 30° to 50° with respect to the center point of the wafer, so that the spacing between these points generally exceeds the so-called "wafer flat", which is a widely used flattening provided on the circumference of the wafers for marking the orientation. Even smaller angles are possible, i.e., smaller spacings between points 34, up to the minimum limit, in which two points 34 coincide at 0°. However, with such designs, one has to make sure when loading the wafers that the "wafer flat" will always come to rest next to the points 34. The fixing of the wafers by the row(s) of retention cones 19 is shown in greater detail in FIGS. 8, 9 and 10.

Figure 8:
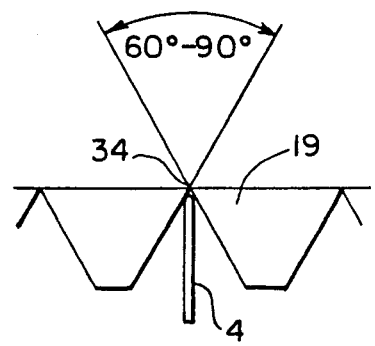
FIG. 8 is an enlarged fragmentarily-illustrated partially schematic longitudinal side view of the packaging unit lid depicting the range of the angle formed by the conical sides of two adjacent retention cones and the position of a wafer relative thereto.
Figure 9:
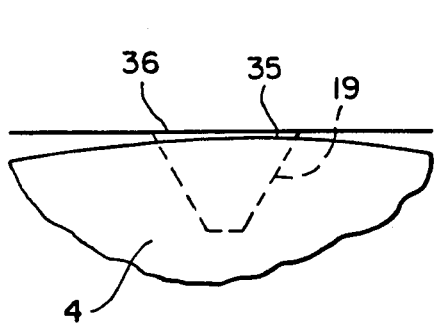
FIG. 9 is an enlarged fragmentarily-illustrated schematic side view of the lid and one retention core thereof showing the position of a wafer with respect thereto.

According to FIG. 8, wafer 4 is in contact with the retention cones 19 at the points 34 in such a way that the edge of the wafer is in contact with the lid at the point where two adjacent retention cones join each other, with their said conical sides forming an angle of from 60° to 90° with respect to each other. FIG. 9 shows that, in this way, the outer edge of wafer 4 remains separated from the wall 36 of the lid by an intermediate space 35.

Figure 10:
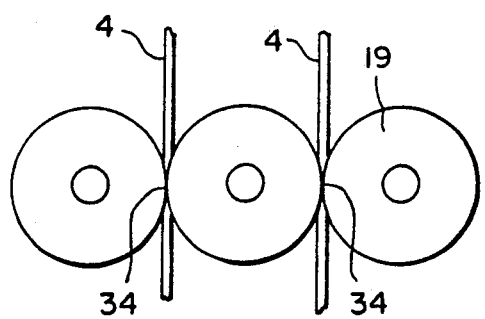
FIG. 10 is an enlarged, partially schematic plan view illustrating a row of retention cones and the wafers retained therebetween.

FIG. 10 shows a top plan view of a row of retention cones 19 with wafers 4 arranged between the cones. The spacing of the center points of the cones is equal to the desired spacing between the wafers and the spacing of the guide ribs in the wafer carrier 3.

In the packaging unit described herein according to the invention, the wafers are supported or held by the spring action of the lid within the zone of the rows of retention cones, the spring action of the spring tongues and, in the end by the holding forces of the snap closures. Consequently, the fixation is achieved exclusively by the mechanical and elasticity properties of the packaging material and not by any pressure differences between the interior of the packaging unit and the ambient atmosphere. Even variations in the wafer diameters will not have any influence unless the normal tolerances are exceeded.

In the preferred embodiment, a defined 4-point support of the wafers 4 in the lid 2 and wafer carrier 3 is achieved by virtue of the geometry of the total package. Should the wafer flat come to rest next to one of the contact points 34, the fixation is kept intact with the help of the three remaining points of support. In the event only one row of holding cones is provided along the crest line of the lid 2, a defined three-point support is always assured so long as the positioning of the wafer "flat" at one of the points 34 or 35 is prevented when the wafers are loaded.

After the packaging unit is loaded with semiconductor wafers, it is placed in a protective foil bag, which, in most cases, is a multi-layered material with as little permeability to gas, air and vapors as possible. The bag is normally then sealed hermetically to about 50 to 500 hPa reduced pressure, after adding a protective gas, if necessary. In this way, the protective foil bag cannot inflate or be destroyed when it is transported in aircraft which afford only partial pressure compensation in the freight compartment.

In addition to its low weight and relatively low cost, the packaging unit of the invention has the special advantage that both the individual outer parts and the complete package can be stacked. Furthermore, the wafer carrier can be used in the form of process trays not only when stored, but also in some processing steps, for example, in certain cleaning procedures. This additional application possibility is favored by the fact that due to the fixation of the wafers with the help of spring tongues, the wafer carrier can be designed in a very open way with nearly vertically sloping guide ribs and side walls.

While only a few embodiments of the present invention have been shown and described, it will be obvious to those skilled in the art that many changes and modifications may be made thereunto, without departing from the spirit and scope of the invention.

What is claimed is:

1. In a packaging unit for semiconductor wafers of the type including a wafer carrier for receiving the wafers which is open at the top and bottom and has guide ribs on both longitudinal sides and a crossbar at one open end face thereof, a generally tub-shaped container for receiving the wafer carrier, and a matching lid having a cross-sectional generally polygonal profile configured to generally conform to the circumference of the wafers, the improvement comprising:

said container having a plurality of lateral surface portions arranged to fix the wafer carrier in the longitudinal and transverse directions with predetermined close tolerances;

snap lock means for connecting said container and said matching lid to each other;

said wafer carrier having a plurality of spring tongues arranged on both longitudinal sides thereof such that they are each disposed between a pair of adjacent guide ribs on the same level corresponding to about one fifth to one third of the lateral height of said carrier, said tongues having a free end extending downwardly into the interior of the wafer carrier at an angle deviating from 0° to 30° from the horizontal, with the length of said tongues being selected such that, upon loading of a wafer, the points of support of a wafer on said tongues and the center point of the wafer enclose an angle of from 75° to 120°; and said lid having a plurality of retention cones arranged on the inner side thereof in at least one row, said cones projecting inwardly and abutting each other at their bases with the spacing between the center points of adjacent cones being equal to the spacing of the guide ribs in the wafer carrier and the conical surfaces of adjacent retention cones cooperatively defining an included angle of from 60° to 90°, said cones being positioned such that, when a wafer is received within the packaging unit and the lid is closed, their points of contact on the edge of the wafer form an angle of from 0° to 50°, with respect to the center of the wafer, said lid also having a step-like ledge for fixing the wafer carrier within said matching lid and container which aligns a top edge of said wafer carrier with said lid such that corresponding and oppositely-disposed guide ribs and retention cones are arranged in one plane, whereby when the wafers are received within the packaging unit and the lid is closed, the wafers come into contact only with the conical surfaces of adjacent holding cones and the free end of the spring tongues.

2. The packaging unit as recited in claim 1, wherein said matching lid is made of transparent plastic material.

3. The packaging unit as recited in claim 1, wherein said spring tongues have two semi-cylindrical humps at their ends, said humps being separated by a V-shaped notch extending in the longitudinal direction and having a base surface with a convex curvature.

4. The packaging unit as recited in claim 1, wherein recesses are provided in the area of contact between the lower portion and matching lid to permit the pressure compensation between the interior of the package and the environment.

5. The packaging unit as recited in claim 1, wherein at least at one corner of the package, the rim of the lid and the outer edge of the lower portion end in flaps displaced by about 90° from one another.

6. The packaging unit as recited in claim 1, wherein the angle formed by the points of contact of the cones on the edge of the wafer is from 30° to 50° with respect to the center of the wafer.

7. The packaging unit as recited in claim 1, wherein two spaced-apart rows of retention cones are arranged on the inner side of said lid mirror-symmetrically with respect to the crest line of said lid.

* * * * *

UNITED STATES PATENT AND TRADEMARK OFFICE
CERTIFICATE OF CORRECTION

PATENT NO. : 4,555,024
DATED : NOVEMBER 26, 1985
INVENTOR(S) : JURGEN VOSS ET AL

It is certified that error appears in the above-identified patent and that said Letters Patent are hereby corrected as shown below:

Cover page, item 73, Assignee should be --Wacker-Chemitronic Gesellschaft fur Elektronik Grundstoffe mbh--.

Signed and Sealed this

Third Day of June 1986

[SEAL]

Attest:

DONALD J. QUIGG

Attesting Officer

Commissioner of Patents and Trademarks